United States Patent [19]

Hirose et al.

[11] Patent Number: 5,289,020

[45] Date of Patent: Feb. 22, 1994

[54] HETEROJUNCTION BIPOLAR TRANSISTOR

[75] Inventors: Takashi Hirose; Toshinobu Matsuno; Kaoru Inoue, all of Osaka, Japan

[73] Assignee: Matsushita Electric Industrial Co., Ltd., Osaka, Japan

[21] Appl. No.: 913,316

[22] Filed: Jul. 15, 1992

[30] Foreign Application Priority Data

Apr. 28, 1992 [JP] Japan .................................. 4-109655

[51] Int. Cl.⁵ .................. H01L 31/072; H01L 31/109; H01L 27/102
[52] U.S. Cl. .................................... 257/197; 257/198; 257/565; 257/592
[58] Field of Search .................. 257/197, 198, 12, 565

[56] References Cited

U.S. PATENT DOCUMENTS 4,987,468 1/1991 Thornton ............................ 257/198

OTHER PUBLICATIONS

"Collector-Up HBT's Fabricated by Be+ and O+ Ion Implantations" by Sadao Adachi et al; IEEE Electron Device Letters, vol. EDL-7, No. 1; Jan. 1986; pp. 32–34.

Primary Examiner—Rolf Hille
Assistant Examiner—Wael Fahmy
Attorney, Agent, or Firm—Lowe, Price, LeBlanc & Becker

[57] ABSTRACT

A heterojunction bipolar transistor includes a first emitter region. A second emitter region extends on the first emitter region and is connected to the first emitter region via a junction. The second emitter region has a forbidden band gap wider than a forbidden band gap of the first emitter region. At the junction, the second emitter region has a carrier energy level substantially equal to a carrier energy level of the first emitter region. An intrinsic base region extends on the second emitter region and has a forbidden band gap narrower than the forbidden band gap of the second emitter region. A collector region extends on the intrinsic base region. An extrinsic base region extends outward of the intrinsic base region and contacts the intrinsic base region and the second emitter region. The extrinsic base region separates from the first emitter region. A portion of the extrinsic base region which adjoins the second emitter region has a forbidden band gap substantially equal to the forbidden band gap of the second emitter region. A high-resistivity region extends underneath the extrinsic base region.

8 Claims, 7 Drawing Sheets

HETEROJUNCTION BIPOLAR TRANSISTOR

BACKGROUND OF THE INVENTION

This invention relates to a heterojunction bipolar transistor (HBT). This invention also relates to a method of fabricating a heterojunction bipolar transistor.

Heterojunction bipolar transistors (HBT's) are advantageous in high-speed operation. Some HBT's have a collector-up structure in which a collector is situated over a base which is situated over an emitter situated over a substrate. In general, the base-emitter parasitic capacitance of collector-up fly HBT's is smaller than that of a normal emitter-up structure, so that the collector-up HBT's are better in high-speed operation. In addition, it is generally easy to form a common emitter circuit by using a common emitter layer in an array of collector-up HBT'S. Thus, it is hopeful that collector-up HBT's can be made into a highly-integrated circuit.

As will be explained later, a prior-art collector-up HBT has some problems.

SUMMARY OF THE INVENTION

It is an object of this invention to provide an improved heterojunction bipolar transistor.

It is another object of this invention to provide a method of fabricating an improved heterojunction bipolar transistor.

A first aspect of this invention provides a heterojunction bipolar transistor comprising a first emitter region; a second emitter region extending on the first emitter region and connected to the first emitter region via a junction, the second emitter region having a forbidden band gap wider than a forbidden band gap of the first emitter region, wherein, at the junction, the second emitter region has a carrier energy level substantially equal to a carrier energy level of the first emitter region; an intrinsic base region extending on the second emitter region and having a forbidden band gap narrower than the forbidden band gap of the second emitter region; a collector region extending on the intrinsic base region; an extrinsic base region extending outward of the intrinsic base region and contacting the intrinsic base region and the second emitter region, the extrinsic base region separating from the first emitter region, wherein a portion of the extrinsic base region which adjoins the second emitter region has a forbidden band gap substantially equal to the forbidden band gap of the second emitter region; and a high-resistivity region extending underneath the extrinsic base region.

A second aspect of this invention provides a method of fabricating a heterojunction bipolar transistor which comprises the steps of forming a multi-layer structure on a substrate, the multilayer structure including a first emitter layer, a second emitter layer, a base layer, and a collector layer, wherein the second emitter layer is connected to the first emitter layer via a junction, wherein the second emitter layer has a forbidden band gap wider than a forbidden band gap of the first emitter layer, wherein, at the junction, the second emitter layer has a carrier energy level substantially equal to a carrier energy level of the first emitter layer, and wherein the base layer has a forbidden band gap narrower than the forbidden band gap of the second emitter layer; removing a portion of the collector layer while using a mask; executing first ion implantation while using the mask to change a portion of the second emitter layer and a portion of the base layer into an extrinsic base layer after the removing step, the extrinsic base layer extending outward of the base layer and contacting the base layer and the second emitter layer, the extrinsic base layer separating from the first emitter layer; and executing second ion implantation while using the mask to form a high-resistivity layer extending underneath the extrinsic base layer after the removing step.

A third aspect of this invention provides a method of fabricating a heterojunction bipolar transistor which comprises the steps of forming a multi-layer structure on a substrate, the multilayer structure including a first emitter layer, a second emitter layer, a base layer, and a collector layer, wherein the second emitter layer is connected to the first emitter layer via a junction, wherein the second emitter layer has a forbidden band gap wider than a forbidden band gap of the first emitter layer, and wherein, at the junction, the second emitter layer has a carrier energy level substantially equal to a carrier energy level of the first emitter layer; removing a portion of the collector layer while using a mask; executing impurity diffusion while using the mask to change a portion of the second emitter layer and a portion of the base layer into an extrinsic base layer after the removing step, the extrinsic base layer extending outward of the base layer and contacting the base layer and the second emitter layer, the extrinsic base layer separating from the first emitter layer; and executing ion implantation while using the mask to form a high-resistivity layer extending underneath the extrinsic base layer after the removing step.

A fourth aspect of this invention provides a heterojunction bipolar transistor comprising a first emitter region; a second emitter region extending on the first emitter region and connected to the first emitter region via a first junction, the second emitter region having a forbidden band gap wider than a forbidden band gap of the first emitter region, wherein, at the first junction, the second emitter region has a carrier energy level substantially equal to a carrier energy level of the first emitter region; a third emitter region extending on the second emitter region and connected to the second emitter region via a second junction, the third emitter region having a forbidden band gap narrower than the forbidden band gap of the second emitter region, wherein, at the second junction, the third emitter region has a carrier energy level substantially equal to a carrier energy level of the second emitter region; an intrinsic base region extending on the third emitter region and having a forbidden band gap narrower than the forbidden band gap of the third emitter region; a collector region extending on the intrinsic base region; an extrinsic base region extending outward of the intrinsic base region, wherein a portion of the extrinsic base region which adjoins the second emitter region has a forbidden band gap substantially equal to the forbidden band gap of the second emitter region, and wherein the extrinsic base region contacts the intrinsic base region, the second emitter region, and the third emitter region but separates from the first emitter region; and a high-resistivity region extending underneath the extrinsic base region.

A fifth aspect of this invention provides a method of fabricating a heterojunction bipolar transistor which comprises the steps of forming a multi-layer structure on a substrate, the multilayer structure including a first emitter layer, a second emitter layer, a third emitter layer, a base layer, and a collector layer, wherein the second emitter layer is connected to the first emitter layer via a first junction, wherein the second emitter layer has a forbidden band gap wider than a forbidden band gap of the first emitter layer, wherein, at the first junction, the second emitter layer has a carrier energy level substantially equal to a carrier energy level of the first emitter layer, wherein the third emitter layer is connected to the second emitter layer via a second junction, wherein the third emitter layer has a forbidden band gap narrower than the forbidden band gap of the second emitter layer, wherein, at the second junction, the third emitter layer has a carrier energy level substantially equal to a carrier energy level of the second emitter layer, and wherein the base layer has a forbidden band gap narrower than the forbidden band gap of the third emitter layer; removing a portion of the collector layer while using a mask; executing first ion implantation while using the mask to change a portion of the second emitter layer, a portion of the third emitter layer, and a portion of the base layer into an extrinsic base layer after the removing step, the extrinsic base layer extending outward of the base layer, wherein the extrinsic base layer contacts the base layer, the second emitter layer, and the third emitter layer but separates from the first emitter layer; and executing second ion implantation while using the mask to form a high-resistivity layer extending underneath the extrinsic base layer after the removing step.

A sixth aspect of this invention provides a method of fabricating a heterojunction bipolar transistor which comprises the steps of forming a multi-layer structure on a substrate, the multilayer structure including a first emitter layer, a second emitter layer, a third emitter layer, a base layer, and a collector layer, wherein the second emitter layer is connected to the first emitter layer via a first junction, wherein the second emitter layer has a forbidden band gap wider than a forbidden band gap of the first emitter layer, wherein, at the first junction, the second emitter layer has a carrier energy level substantially equal to a carrier energy level of the first emitter layer, wherein the third emitter layer is connected to the second emitter layer via a second junction, wherein the third emitter layer has a forbidden band gap narrower than the forbidden band gap of the second emitter layer, wherein, at the second junction, the third emitter layer has a carrier energy level substantially equal to a carrier energy level of the second emitter layer, and wherein the base layer has a forbidden band gap narrower than the forbidden band gap of the third emitter layer; removing a portion of the collector layer while using a mask; executing impurity diffusion while using the mask to change a portion of the second emitter layer, a portion of the third emitter layer, and a portion of the base layer into an extrinsic base layer after the removing step, the extrinsic base layer extending outward of the base layer, wherein the extrinsic base layer contacts the base layer, the second emitter layer, and the third emitter layer but separates from the first emitter layer; and executing ion implantation while using the mask to form a high-resistivity layer extending underneath the extrinsic base layer after the removing step.

DESCRIPTION OF THE PRIOR ART

IEEE Electron Device Letters, Vol. EDL-7, No. 1, January 1986, pp 32-34, discloses a prior-art collector-up HBT and a method of fabricating the same.

Figure 1A:
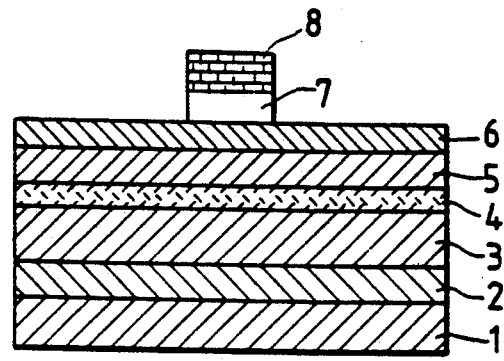
FIGS. 1(a)-(c) have sectional views of a semiconductor wafer in different states which occur during the fabrication of a prior-art heterojunction bipolar transistor.
Figure 1B:
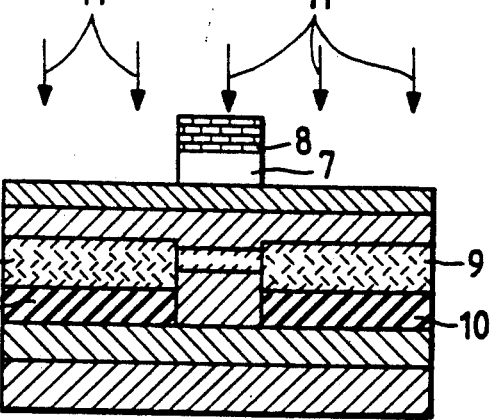
Figure 1C:
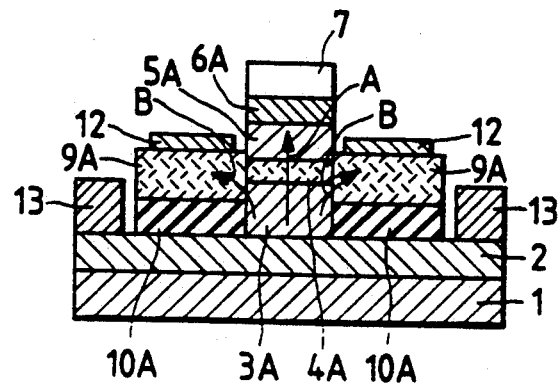

The sections (a), (b), and (c) of FIG. 1 show wafer structures which occur at different stages during the fabrication of the prior-art HBT. As best shown in the section (c) of FIG. 1, the prior-art HBT includes a semiconductor substrate 1 on which an emitter contact layer 2 is superposed. An emitter region 3A is formed on a given area of the emitter contact layer 2. An intrinsic base region 4A is superposed on the emitter region 3A. The intrinsic base region 4A is made of material which has a forbidden band gap (a forbidden band width) narrower than that of the emitter region 3A. A collector region 5A and a collector cap region 6A are sequentially superposed on the intrinsic base region 4A. A collector electrode 7 is superposed on the collector cap region 6A. The collector electrode 7 is formed by an etching process using a mask 8 (see the sections (a) and (b) of FIG. 1).

A high-resistivity region 10A and an extrinsic base region 9A are sequentially superposed on the area of the emitter contact layer 2 which extends outward of the emitter region 3A and the intrinsic base region 4A. As shown in the section (b) of FIG. 1, the high-resistivity region 10A and the extrinsic base region 9A are formed by selective ion implantations into the wafer while the collector electrode 7 and the mask 8 are used as implantation masks. During the ion implantation, ion beams are applied to the wafer in a direction as denoted by the arrows 11 of the section (b) of FIG. 1. A base electrode 12 is formed on the extrinsic base region 9A. An emitter electrode 13 is formed on a given area of the emitter contact layer 2 which extends outward of the extrinsic base region 9A.

In the section (c) of FIG. 1, the arrow "A" denotes a collector current flowing from the emitter region 3A to the collector region 5A via the intrinsic base region 4A, and the arrows "B" denote a leak current flowing from the emitter region 3A to the extrinsic base region 9A.

The prior-art HBT was fabricated as follows. As shown in the section (a) of FIG. 1, a semi-insulating substrate 1 made of GaAs was prepared, and five epitaxial layers were sequentially superposed on the substrate 1. The five epitaxial layers included an emitter contact layer 2, an emitter layer 3, a base layer 4, a collector layer 5, and a collector cap layer 6. The emitter contact layer 2 was made of n+-GaAs (Si-doped, n≈3×10$^{18}$ cm$^{-3}$). The emitter layer 3 was made of N-Al$_{0.3}$Ga$_{0.7}$As. The base layer 4 was made of p+-GaAs (Be-doped, p≈1×10$^{19}$ cm$^{-3}$). The collector layer 5 was made of n-GaAs. The collector cap layer 6 was made of n+-GaAs (Si-doped, n≈5×10$^{18}$ cm$^{-3}$). In this way, the wafer was provided with the multi-layer structure. Then, a collector electrode 7 made of W was formed on the collector cap layer 6 by dry etching which used a mask 8.

Subsequently, as shown in the section (b) of FIG. 1, selective Be+ and O+ ion-implantations 11 into the wafer were carried out while the collector electrode 7 and the mask 8 were used as implantation masks. After the ion implantations, an annealing process or a thermal process was performed on the wafer. As a result, the portions of the emitter layer 3 and the base layer 4 which extended directly below the collector electrode 7 and the mask 8 formed the emitter region 3A and the intrinsic base region 4A respectively. In addition, an extrinsic base layer 9 and a high-resistivity layer 10 were formed on the area of the emitter contact layer 2 which extended outward of the emitter region 3A and the intrinsic base region 4A. The high-resistivity layer 10 extended underneath the extrinsic base layer 9.

Then, as shown in the section (c) of FIG. 1, the extrinsic base layer 9 was exposed and was made into an extrinsic base region 9A, and the high-resistivity layer 9 was formed into a high-resistivity region 9A extending underneath the extrinsic base region 9A. In addition, the area of the emitter contact layer 2 which extended outward of the extrinsic base region 9A was exposed. A base electrode 12 and an emitter electrode 13 were formed on the exposed extrinsic base region 9A and the exposed emitter contact layer 2 respectively. As a result, the prior-art HBT was completed.

The prior-art HBT has a problem as follows. During the operation at a large current, the current gain of the prior-art HBT tends to be low. In addition, as the size of the prior-art HBT decreases, the current gain thereof is lowered. Specifically, the current gain of the prior-art HBT having a size of several hundreds of a micrometer square is equal to about one tenth of that of a normal emitter-up HBT. As the size of the prior-art HBT is reduced from several hundreds of a micrometer square to several tens of a micrometer square, the current gain thereof is decreased to one tenth.

Figure 2:
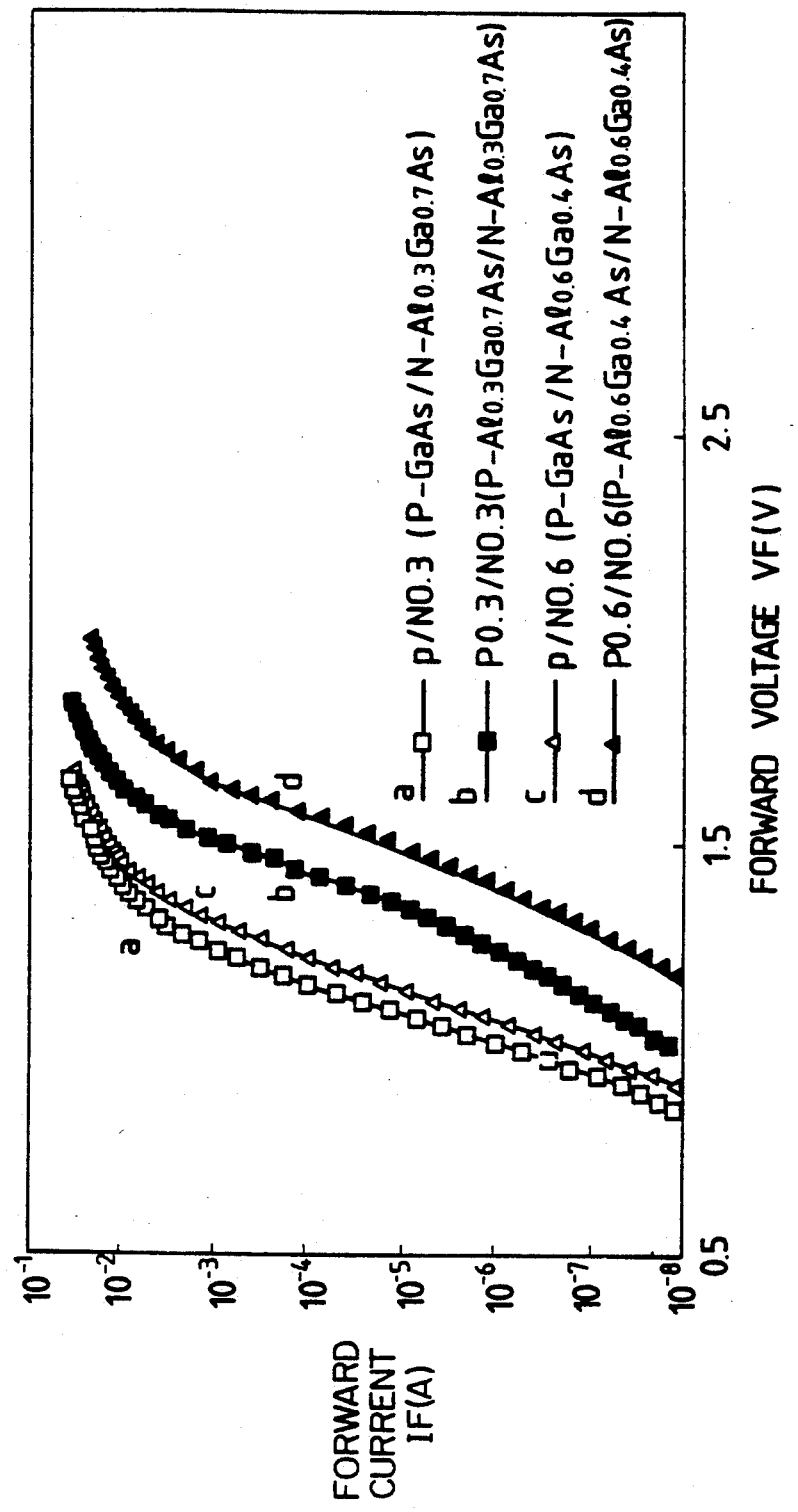
FIG. 2 is a diagram showing the relation between a forward-direction current IF and a forward-direction voltage VF in various pn junctions.

To find out the cause of the problem of the prior-art HBT, experiments were performed on the relation between a forward-direction current IF and a forward-direction voltage VF in various pn junctions having a junction area of 1×10$^4$ μm$^2$. FIG. 2 shows results of the experiments. In FIG. 2: "a" (p/N$_{0.3}$) denotes the current-voltage characteristic curve of a junction of p-GaAs/N-Al$_{0.3}$Ga$_{0.7}$As; "b" (P$_{0.3}$/N$_{0.3}$) denotes the current-voltage characteristic curve of a junction of P-Al$_{0.3}$Ga$_{0.7}$As/N-Al$_{0.3}$Ga$_{0.7}$As; "c" (p/N$_{0.6}$) denotes the current-voltage characteristic curve of a junction of p-GaAs/N-Al$_{0.6}$Ga$_{0.4}$As; and "d" (P$_{0.6}$/N$_{0.6}$) denotes the current-voltage characteristic curve of a junction of P-Al$_{0.6}$Ga$_{0.4}$As/N-Al$_{0.6}$Ga$_{0.4}$As.

The junction of p-GaAs/N-Al$_{0.3}$Ga$_{0.7}$As and the junction of P-GaAs/N-Al$_{0.6}$Ga$_{0.4}$As were fabricated by molecular beam epitaxy while Be was doped at a density of 4×10$^{19}$ cm$^{-3}$ to complete p-GaAs and Si was doped at a density of 5×10$^{17}$ cm$^{-3}$ to complete N-Al$_{0.3}$Ga$_{0.7}$As and N-Al$_{0.6}$Ga$_{0.4}$As. The junction of P-Al$_{0.3}$Ga$_{0.7}$As/N-Al$_{0.3}$Ga$_{0.7}$As and the junction of P-Al$_{0.6}$Ga$_{0.4}$As/N-Al$_{0.6}$Ga$_{0.4}$As were fabricated by annealing the junction of p-GaAs/N-Al$_{0.3}$Ga$_{0.7}$As and the junction of p-GaAs/N-Al$_{0.6}$Ga$_{0.4}$As at 850° C. for 10 seconds, and then diffusing Be to convert portions of N-Al$_{0.3}$Ga$_{0.7}$As and N-Al$_{0.6}$Ga$_{0.4}$As into a P-type.

The current-voltage characteristic curve "a" (p/N$_{0.3}$) of FIG. 2 corresponds to the relation between the collector current "A" and the applied voltage in the prior-art HBT of the section (c) of FIG. 1. The current-voltage characteristic curve "b" (P$_{0.3}$/N$_{0.3}$) of FIG. 2 corresponds to the relation between the leak current "A" and the applied voltage in the prior-art HBT of the section (c) of FIG. 1. The ratio between the current "a" (p/N$_{0.3}$) and the current "b" (P$_{0.3}$/N$_{0.3}$) relates to the current gain of the prior-art HBT. In a small-current range where the current on the current-voltage characteristic curve "a" (p/N$_{0.3}$) is equal to or less than about 1×10$^{-2}$ A, the ratio between the current "a" (p/N$_{0.3}$) and the current "b" (P$_{0.3}$/N$_{0.3}$) has an adequate value. However, in intermediate-current and large-current ranges, the ratio between the current "a" (p/N$_{0.3}$) and the current "b" (P$_{0.3}$/N$_{0.3}$) is adversely affected by a parasitic resistance. For example, in a large-current range where the current on the current-voltage characteristic curve "a" (p/N$_{0.3}$) is equal to about 5×10$^{-2}$ A, the ratio between the current "a" (p/N$_{0.3}$) and the current "b" (P$_{0.3}$/N$_{0.3}$) has an inadequate value.

According to the analysis of the results of the experiments, the following factors are believed to cause the current-gain reductions in the prior-art HBT. Specifically, it is believed that the current-gain reduction in the prior-art HBT at large currents is caused by an inadequate ratio between the corrector current "A" and the leak current "B" (see the section (c) of FIG. 1) which results from the adverse influence of the parasitic resistance. In addition, the cause of the current-gain reduction in the prior-art HBT of a small size seems to be that the leak current "B" agrees with a peripheral leak directed toward the extrinsic base region 9A (see the section (c) of FIG. 1) and thus the leak current "B" is significantly influential at a small size of the HBT.

DESCRIPTION OF THE FIRST PREFERRED EMBODIMENT

Figure 3:
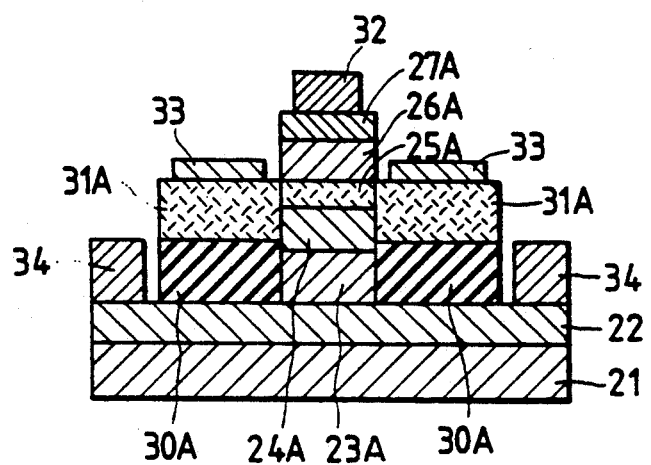
FIG. 3 is a sectional view of a heterojunction bipolar transistor according to a first embodiment of this invention.

With reference to FIG. 3, a heterojunction bipolar transistor (HBT) includes a semiconductor substrate 21 on which an emitter contact layer 22 is superposed. A first emitter region 23A is formed on a given area of the emitter contact layer 22. A second emitter region 24A and an intrinsic base region 25A are sequentially superposed on the first emitter region 23A. The second emitter region 24A is generally made of material which has a forbidden band gap (a forbidden band width) wider than that of the first emitter region 23A. In addition, the portions of the first emitter region 23A and the second emitter region 24A which compose a junction have approximately equal carrier energy levels. The intrinsic base region 25A is made of material which has a forbidden band gap narrower than that of the second emitter region 24A. A collector region 26A and a collector cap region 27A are sequentially superposed on the intrinsic base region 25A. A collector electrode 32 extends on the collector cap region 27A.

A high-resistivity region 30A and an extrinsic base region 31A are sequentially superposed on the area of the emitter contact layer 22 which extends outward of the first and second emitter regions 23A and 24A and the intrinsic base region 25A. The high-resistivity region 30A and the extrinsic base region 31A are formed by selective ion implantations into the wafer while a suitable implantation mask (not shown in FIG. 3) is used. The extrinsic base region 31A contacts the intrinsic base region 25A and the second emitter region 24A but separates from the first emitter region 23A. Specifically, the extrinsic base region 31A is completely separated from the first emitter region 23A by the high-resistivity region 30A and the second emitter region 24A. In addition, the extrinsic base region 31A is completely separated from the emitter contact layer 22 by the high-resistivity region 30A. A portion of the extrinsic base region 31A which adjoins the second emitter region 24A has a forbidden band gap substantially equal to that of the second emitter region 24A. A base electrode 33 is formed on the extrinsic base region 31A. An emitter electrode 34 is formed on a given area of the emitter contact layer 22 which extends outward of the extrinsic base region 31A.

Figure 4A:
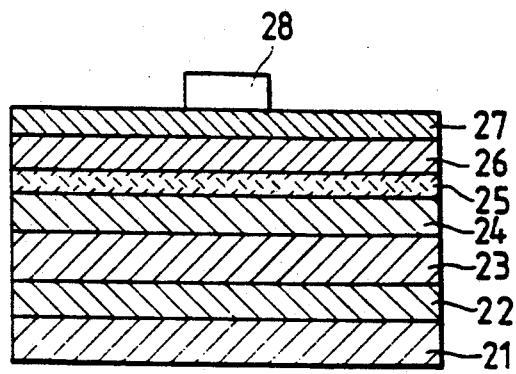
FIGS. 4(a)-(c) have sectional views of a semiconductor wafer in different states which occur during the fabrication of the heterojunction bipolar transistor of FIG. 3.
Figure 4B:
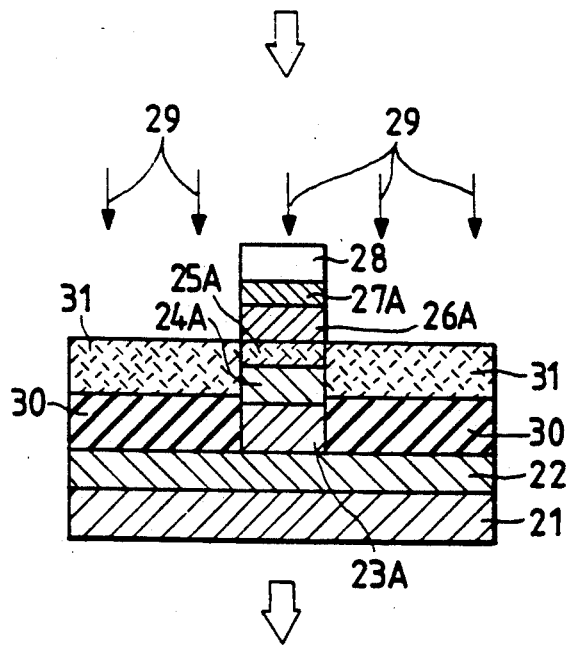
Figure 4C:
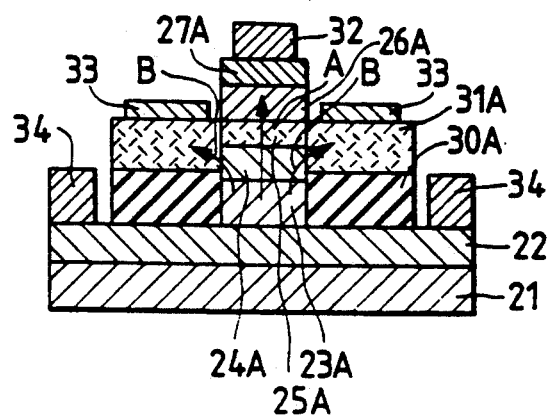

The sections (a), (b), and (c) of FIG. 4 show wafer structures which occur at different stages during the fabrication of the HBT of FIG. 3. A description will be given of a method of fabricating the HBT of FIG. 3 with reference to the sections (a), (b), and (c) of FIG. 4.

Specifically, the HBT of FIG. 3 was fabricated as follows. As shown in the section (a) of FIG. 4, a semi-insulating substrate 21 made of GaAs was prepared, and six epitaxial layers were sequentially superposed on the substrate 21. The six epitaxial layers included an emitter contact layer 22, a first emitter layer 23, a second emitter layer 24, a base layer 25, a collector layer 26, and a collector cap layer 27. The emitter contact layer 22 was made of $n^+$-GaAs (for example, Si-doped, $n \approx 3 \times 10^{18}$ cm$^{-3}$) which had a high carrier concentration (density). The first emitter layer 23 was made of N-$Al_{0.3}Ga_{0.7}As$. The second emitter layer 24 was made of N-$Al_{0.6}Ga_{0.4}As$. The base layer 25 was made of $p^+$-GaAs (for example, Be-doped, $p \approx 1 \times 10^{19}$ cm$^{-3}$) which had a high carrier concentration (density). The collector layer 26 was made of n-GaAs. The collector cap layer 27 was made of $n^+$-GaAs (for example, Si-doped, $n \approx 5 \times 10^{18}$ cm$^{-3}$) which had a high carrier concentration (density). In this way, the wafer was provided with the multi-layer structure. Then, a mask 28 was formed on the collector cap layer 27.

Subsequently, the wafer was subjected to an etching process while the mask 28 was used. As a result of the etching process, the portion of the base layer 25 which extended outward of the mask 28 was exposed. In addition, as shown in the portion (b) of FIG. 4, the portions of the collector layer 26 and the collector cap layer 27 which extended outward of the mask 28 were removed so that the remaining portions of the collector layer 26 and the collector cap layer 27 which extended underneath the mask 28 formed the collector region 26A and the collector cap region 27A respectively.

Then, as shown in the section (b) of FIG. 4, selective $Mg^+$ and $O^+$ ion implantations 29 into the wafer were carried out while the collector region 26A, the collector cap region 27A, and the mask 28 were used as implantation masks. After the ion implantations, an annealing process or a thermal process for activation was performed on the wafer. As a result, the portions of the first emitter layer 23, the second emitter layer 24, and the base layer 25 which extended outward of the implantation masks were changed to a high-resistivity layer 30 and an extrinsic base layer 31. Specifically, the high-resistivity layer 30 was formed by the $O^+$ ion implantation while the extrinsic base layer 31 was formed by the $Mg^+$ ion implantation. The remaining portions of the first emitter layer 23, the second emitter layer 24, and the base layer 25 which extended underneath the implantation masks formed the first emitter region 23A, the second emitter region 24A, and the intrinsic base region 25A respectively. The high-resistivity layer 30 and the extrinsic base layer 31 were sequentially superposed on the area of the emitter contact layer 22 which extended outward of the first emitter region 23A, the second emitter region 24A, and the intrinsic base region 25A. In a region outward of the first emitter region 23A, the second emitter region 24A, and the intrinsic base region 25A, the high-resistivity layer 30 originated from the first emitter layer 23 and a lower part of the second emitter layer 24 while the extrinsic base layer 31 originated from the remaining part of the second emitter layer 24 and the base layer 25. The extrinsic base layer 31 contacted the second emitter region 24A but separated from the first emitter region 23A. The high-resistivity layer 30 extended underneath the extrinsic base layer 31 to separate the extrinsic base layer 31 from the first emitter region 23A and the emitter contact layer 22.

Then, as shown in the section (c) of FIG. 4, the mask 28 was removed, and the high-resistivity layer 30 and the extrinsic base layer 31 were formed into the high-resistivity region 30A and the extrinsic base region 31A respectively. The high-resistivity region 30A extended underneath the extrinsic base region 31A. The extrinsic base region 31A contacted the intrinsic base region 25A and the second emitter region 24A but separated from the first emitter region 23A. The area of the emitter contact layer 22 which extended outward of the high-resistivity region 30A and the extrinsic base region 31A was exposed. A base electrode 33 and an emitter electrode 34 were formed on the exposed extrinsic base region 31A and the exposed emitter contact layer 22 respectively. As a result, the HBT of FIG. 3 was completed.

In the section (c) of FIG. 4, the arrow "A" denotes a collector current flowing from the first emitter region 23A to the collector region 26A via the second emitter region 24A and the intrinsic base region 25A, and the arrows "B" denote a leak current flowing from the first emitter region 23A to the extrinsic base region 31A via the second emitter region 24A.

The HBT of FIG. 3 has the following advantages. An emitter has a two-layer structure including the first and second emitter regions 23A and 24A. The extrinsic base region 31A contacts the second emitter region 24A of N-$Al_{0.6}Ga_{0.4}As$ but separates from the first emitter region 23A of N-$Al_{0.3}Ga_{0.7}As$. Thus, the leak current "B" in the section (e) of FIG. 4 corresponds to the current-voltage characteristic curve "d" ($P_{0.6}/N_{0.6}$) of FIG. 2. In addition, the collector current "A" in the section (c) of FIG. 4 corresponds to the current-voltage characteristic curve "c" ($p/N_{0.6}$) of FIG. 2. Accordingly, the ratio between the collector current "A" and the leak current "B" in the HBT of FIG. 3 is better than that in the prior-art HBT (see the section (c) of FIG. 1) including the combination of the junction "$p/N_{0.3}$" and the junction "$P_{0.3}/N_{0.3}$". Furthermore, in a large-current range, the HBT of FIG. 3 is less adversely affected by the parasitic resistance and has a larger current gain as compared with the prior-art HBT (see the section (c) of FIG. 1).

As described previously, the first emitter region 23A is made of N-Al$_{0.3}$Ga$_{0.7}$As while the second emitter region 24A is made of N-Al$_{0.6}$Ga$_{0.4}$. Thus, carrier energy levels at the lower edges of conduction bands in the first and second emitter regions 23A and 24A are approximately equal to each other, so that carriers (electrons) can be smoothly and freely moved between the first and second emitter regions 23A and 24A.

It should be noted that the first embodiment may be modified as follows. In a first modification, Mg in the ion implantation is replaced by C, Be, or Zn. In a second modification, Mg ion used in the ion implantation is replaced by a combination of at least two of Mg ion, C ion, Be ion, and Zn ion. In a third modification, O ion used in the ion implantation is replaced by other ion such as H ion or B ion.

DESCRIPTION OF THE SECOND PREFERRED EMBODIMENT

Figure 5A:
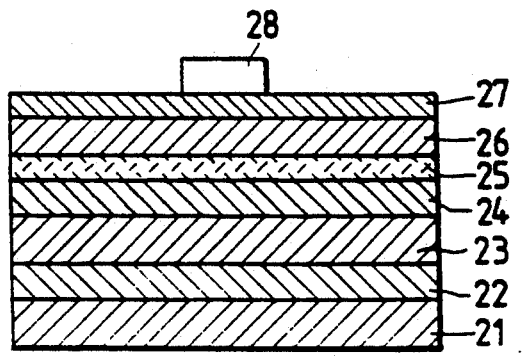
FIGS. 5(a)-(c) have sectional views of a semiconductor wafer in different states which occur during the fabrication of a heterojunction bipolar transistor according to a second embodiment of this invention.
Figure 5B:
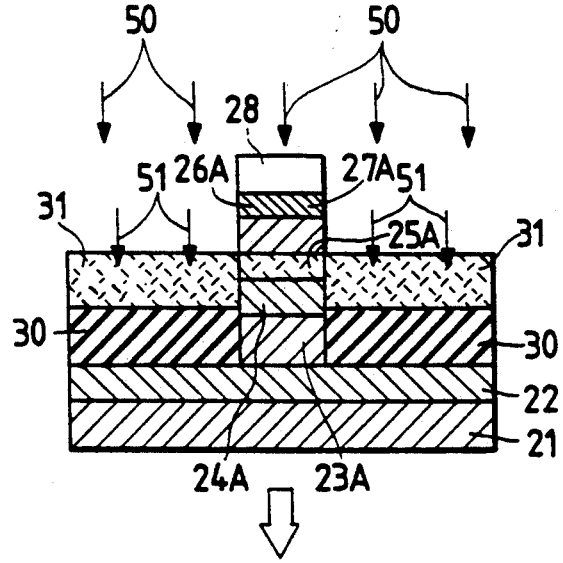
Figure 5C:
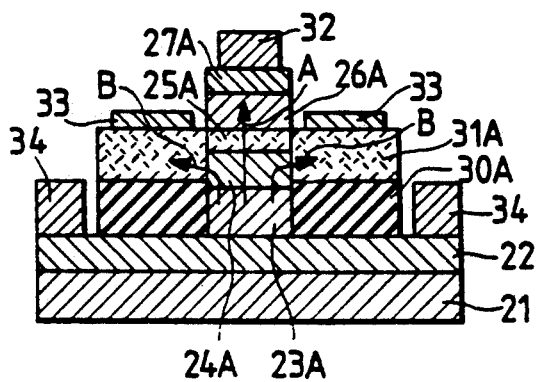

FIG. 5 relates to a second embodiment of this invention which is similar in structure to the embodiment of FIGS. 3 and 4. The sections (a), (b), and (c) of FIG. 5 show wafer structures which occur at different stages during the fabrication of a heterojunction bipolar transistor (HBT) of the second embodiment. A description will be given of a method of fabricating the HBT of the second embodiment with reference to the sections (a), (b), and (c) of FIG. 5.

Specifically, the HBT of the second embodiment was fabricated as follows. As shown in the section (a) of FIG. 5, a semi-insulating substrate 21 made of GaAs was prepared, and six epitaxial layers were sequentially superposed on the substrate 21. The six epitaxial layers included an emitter contact layer 22, a first emitter layer 23, a second emitter layer 24, a base layer 25, a collector layer 26, and a collector cap layer 27. The emitter contact layer 22 was made of n$^+$-GaAs (for example, Si-doped, n$\approx$3$\times$10$^{18}$ cm$^{-3}$) which had a high carrier concentration (density). The first emitter layer 23 was made of N-Al$_{0.3}$Ga$_{0.7}$As. The second emitter layer 24 was made of N-Al$_{0.6}$Ga$_{0.4}$As. The base layer 25 was made of p$^+$-GaAs (for example, Be-doped, p$\approx$1$\times$10$^{19}$ cm$^{-3}$) which had a high carrier concentration (density). The collector layer 26 was made of n-GaAs. The collector cap layer 27 was made of n$^+$-GaAs (for example, Si-doped, n$\approx$5$\times$10$^{18}$ cm$^{-3}$) which had a high carrier concentration (density). In this way, the wafer was provided with the multi-layer structure. Then, a mask 28 was formed on the collector cap layer 27.

Subsequently, the wafer was subjected to an etching process while the mask 28 was used. As a result of the etching process, the portion of the base layer 25 which extended outward of the mask 28 was exposed. In addition, as shown in the portion (b) of FIG. 5, the portions of the collector layer 26 and the collector cap layer 27 which extended outward of the mask 28 were removed so that the remaining portions of the collector layer 26 and the collector cap layer 27 which extended underneath the mask 28 formed the collector region 26A and the collector cap region 27A respectively.

Then, as shown in the section (b) of FIG. 5, a flow 51 of impurity of Zn was applied to the area of the wafer which extended outward of the mask 28 so that the impurity was injected and diffused into the area of the wafer. In addition, selective B$^+$ ion implantation 50 into the wafer was carried out while the collector region 26A, the collector cap region 27A, and the mask 28 were used as implantation masks. As a result, the portions of the first emitter layer 23, the second emitter layer 24, and the base layer 25 which extended outward of the implantation masks were changed to a high-resistivity layer 30 and an extrinsic base layer 31. Specifically, the high-resistivity layer 30 was formed by the ion implantation while the extrinsic base layer 31 was formed by the impurity diffusion. It was preferable that the impurity diffusion was executed after the ion implantation. In this case, heating involved in the impurity diffusion was used also as annealing for completing the high-resistivity layer 30. The remaining portions of the first emitter layer 23, the second emitter layer 24, and the base layer 25 which extended underneath the implantation masks formed the first emitter region 23A, the second emitter region 24A, and the intrinsic base region 25A respectively. The high-resistivity layer 30 and the extrinsic base layer 31 were sequentially superposed on the area of the emitter contact layer 22 which extended outward of the first emitter region 23A, the second emitter region 24A, and the intrinsic base region 25A. In a region outward of the first emitter region 23A, the second emitter region 24A, and the intrinsic base region 25A, the high-resistivity layer 30 originated from the first emitter layer 23 and a lower part of the second emitter layer 24 while the extrinsic base layer 31 originated from the remaining part of the second emitter layer 24 and the base layer 25. The extrinsic base layer 31 contacted the second emitter region 24A but separated from the first emitter region 23A. The high-resistivity layer 30 extended underneath the extrinsic base layer 31 to separate the extrinsic base layer 31 from the fist emitter region 23A and the emitter contact layer 22.

Then, as shown in the section (c) of FIG. 5, the mask 28 was removed, and the high-resistivity layer 30 and the extrinsic base layer 31 were formed into the high-resistivity region 30A and the extrinsic base region 31A respectively. The high-resistivity region 30A extended underneath the extrinsic base region 31A. The extrinsic base region 31A contacted the intrinsic base region 25A and the second emitter region 24A but separated from the first emitter region 23A. The area of the emitter contact layer 22 which extended outward of the high-resistivity region 30A and the extrinsic base region 31A was exposed. A base electrode 33 and an emitter electrode 34 were formed on the exposed extrinsic base region 31A and the exposed emitter contact layer 22 respectively. As a result, the HBT of the second embodiment was completed.

In the section (c) of FIG. 5, the arrow "A" denotes a collector current flowing from the first emitter region 23A to the collector region 26A via the second emitter region 24A and the intrinsic base region 25A, and the arrows "B" denote a leak current flowing from the first emitter region 23A to the extrinsic base region 31A via the second emitter region 24A.

The HBT of the second embodiment has the following advantages. An emitter has a two-layer structure including the first and second emitter regions 23A and 24A. The extrinsic base region 31A contacts the second emitter region 24A of N-Al$_{0.6}$Ga$_{0.4}$As but separates from the first emitter region 23A of N-Al$_{0.3}$Ga$_{0.7}$As. Thus, the leak current "B" in the section (c) of FIG. 5 corresponds to the current-voltage characteristic curve "d" ($P_{0.6}/N_{0.6}$) of FIG. 2. In addition, the collector current "A" in the section (c) of FIG. 5 corresponds to the current-voltage characteristic curve "c" (p/$N_{0.6}$) of FIG. 2. Accordingly, the ratio between the collector current "A" and the leak current "B" in the HBT of the second embodiment is better than that in the prior-art HBT (see the section (c) of FIG. 1) including the combination of the junction "p/$N_{0.3}$" and the junction "$P_{0.3}/N_{0.3}$". Furthermore, in a large-current range, the HBT of the second embodiment is less adversely affected by the parasitic resistance and has a larger current gain as compared with the prior-art HBT (see the section (c) of FIG. 1). In addition, the impurity diffusion enables the surface of the extrinsic base layer 31 to be high in carrier concentration (density), so that the resultant base resistance can be lowered.

The method of fabricating the HBT of the second embodiment can be relatively simple since heating involved in the impurity diffusion can be used also as annealing for completing the high-resistivity layer 30.

As described previously, the first emitter region 23A is made of N-$Al_{0.3}Ga_{0.7}As$ while the second emitter region 24A is made of N-$Al_{0.6}Ga_{0.4}$. Thus, carrier energy levels at the lower edges of conduction bands in the first and second emitter regions 23A and 24A are approximately equal to each other, so that carriers (electrons) can be smoothly and freely moved between the first and second emitter regions 23A and 24A.

It should be noted that the second embodiment may be modified as follows. In a first modification, Zn used in the impurity diffusion is replaced by Be or Mg. In a second modification, B ion used in the ion implantation is replaced by other ion such as H ion or O ion.

DESCRIPTION OF THE THIRD PREFERRED EMBODIMENT

Figure 6A:
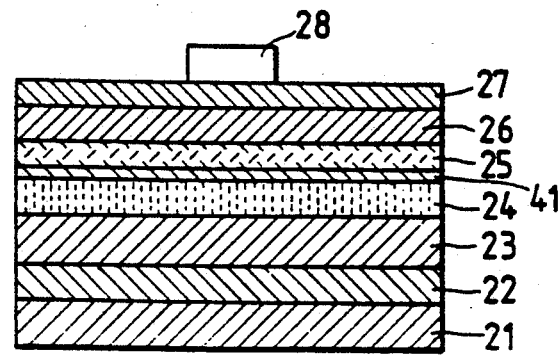
FIGS. 6(a)-(c) have sectional views of a semiconductor wafer in different states which occur during the fabrication of a heterojunction bipolar transistor according to a third embodiment of this invention.
Figure 6B:
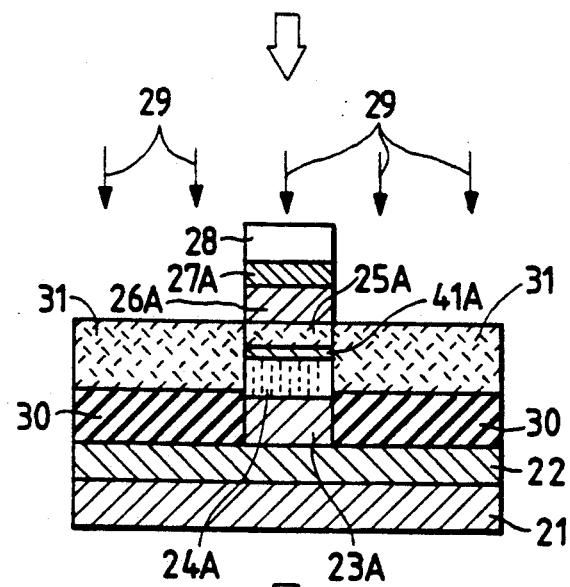
Figure 6C:
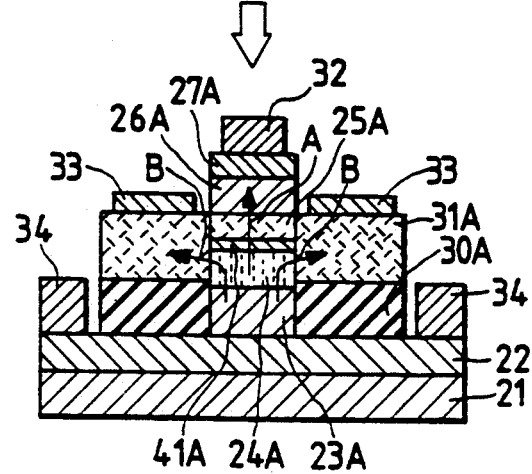

With reference to the section (c) of FIG. 6, a heterojunction bipolar transistor (HBT) includes a semiconductor substrate 21 on which an emitter contact layer 22 is superposed. A first emitter region 23A is formed on a given area of the emitter contact layer 22. A second emitter region 24A, a third emitter region 41A, and an intrinsic base region 25A are sequentially superposed on the first emitter region 23A. The second emitter region 24A is generally made of material which has a forbidden band gap (a forbidden band width) wider than that of the first emitter region 23A. In addition, the portions of the first emitter region 23A and the second emitter region 24A which compose a junction have approximately equal carrier energy levels. The third emitter region 41A is generally made of first-conduction type material (n-type conduction material) which has a forbidden band gap narrower than that of the second emitter region 24A. In addition, the portions of the second emitter region 24A and the third emitter region 41A which compose a junction have approximately equal carrier energy levels. The intrinsic base region 25A is made of material which has a forbidden band gap narrower than that of the third emitter region 41A. A collector region 26A and a collector cap region 27A are sequentially superposed on the intrinsic base region 25A. A collector electrode 32 extends on the collector cap region 27A.

A high-resistivity region 30A and an extrinsic base region 31A are sequentially superposed on the area of the emitter contact layer 22 which extends outward of the first, second, and third emitter regions 23A, 24A, and 41A and the intrinsic base region 25A. The high-resistivity region 30A and the extrinsic base region 31A are formed by selective ion implantations into the wafer while a suitable implantation mask is used. The extrinsic base region 31A contacts the intrinsic base region 25A and the second and third emitter regions 24A and 41A but separates from the first emitter region 23A. Specifically, the extrinsic base region 31A is completely separated from the first emitter region 23A by the high-resistivity region 30A and the second emitter region 24A. In addition, the extrinsic base region 31A is completely separated from the emitter contact layer 22 by the high-resistivity region 30A. A portion of the extrinsic base region 31A which adjoins the second emitter region 24A has a forbidden band gap substantially equal to that of the second emitter region 24A. A base electrode 33 is formed on the extrinsic base region 31A. An emitter electrode 34 is formed on a given area of the emitter contact layer 22 which extends outward of the extrinsic base region 31A.

The sections (a), (b), and (c) of FIG. 6 show wafer structures which occur at different stages during the fabrication of the HBT of the third embodiment. A description will be given of a method of fabricating the HBT of the third embodiment with reference to the sections (a), (b), and (c) of FIG. 6.

Specifically, the HBT of the third embodiment was fabricated as follows. As shown in the section (a) of FIG. 6, a semi-insulating substrate 21 made of GaAs was prepared, and seven epitaxial layers were sequentially superposed on the substrate 21. The seven epitaxial layers included an emitter contact layer 22, a first emitter layer 23, a second emitter layer 24, a third emitter layer 41, a base layer 25, a collector layer 26, and a collector cap layer 27. The emitter contact layer 22 was made of $n^+$-GaAs (for example, Si-doped, $n \approx 3 \times 10^{18}$ cm$^{-3}$) which had a high carrier concentration (density). The first emitter layer 23 was made of N-$Al_{0.3}Ga_{0.7}As$. The second emitter layer 24 was made of N-$Al_{0.6}Ga_{0.4}As$. The third emitter layer 41 was made of N-$Al_{0.3}Ga_{0.7}As$. The base layer 25 was made of $p^+$-GaAs (for example, Be-doped, $p \approx 1 \times 10^{19}$ cm$^{-3}$) which had a high carrier concentration (density). The collector layer 26 was made of n-GaAs. The collector cap layer 27 was made of $n^+$-GaAs (for example, Si-doped, $n \approx 5 \times 10^{18}$ cm$^{-3}$) which had a high carrier concentration (density). In this way, the wafer was provided with the multi-layer structure. Then, a mask 28 was formed on the collector cap layer 27.

Subsequently, the wafer was subjected to an etching process while the mask 28 was used. As a result of the etching process, the portion of the base layer 25 which extended outward of the mask 28 was exposed. In addition, as shown in the portion (b) of FIG. 6, the portions of the collector layer 26 and the collector cap layer 27 which extended outward of the mask 28 were removed so that the remaining portions of the collector layer 26 and the collector cap layer 27 which extended underneath the mask 28 formed the collector region 26A and the collector cap region 27A respectively.

Then, as shown in the section (b) of FIG. 6, selective Mg$^+$ and O$^+$ ion implantations 29 into the wafer were carried out while the collector region 26A, the collector cap region 27A, and the mask 28 were used as implantation masks. After the ion implantations, an annealing process or a thermal process for activation was performed on the wafer. As a result, the portions of the first emitter layer 23, the second emitter layer 24, the third emitter layer 41, and the base layer 25 which extended outward of the implantation masks were changed to a high-resistivity layer 30 and an extrinsic base layer 31. Specifically, the high-resistivity layer 30 was formed by the O+ ion implantation while the extrinsic base layer 31 was formed by the Mg+ ion implantation. The remaining portions of the first emitter layer 23, the second emitter layer 24, the third emitter layer 41, and the base layer 25 which extended underneath the implantation masks formed the first emitter region 23A, the second emitter region 24A, the third emitter region 41A, and the intrinsic base region 25A respectively. The high-resistivity layer 30 and the extrinsic base layer 31 were sequentially superposed on the area of the emitter contact layer 22 which extended outward of the first emitter region 23A, the second emitter region 24A, the third emitter region 41A, and the intrinsic base region 25A. In a region outward of the first emitter region 23A, the second emitter region 24A, the third emitter region 41A, and the intrinsic base region 25A, the high-resistivity layer 30 originated from the first emitter layer 23 and a lower part of the second emitter layer 24 while the extrinsic base layer 31 originated from the remaining part of the second emitter layer 24, the third emitter layer 41, and the base layer 25. The extrinsic base layer 31 contacted the second emitter region 24A and the third emitter region 41A but separated from the first emitter region 23A. The high-resistivity layer 30 extended underneath the extrinsic base layer 31 to separate the extrinsic base layer 31 from the first emitter region 23A and the emitter contact layer 22.

Then, as shown in the section (c) of FIG. 6, the mask 28 was removed, and the high-resistivity layer 30 and the extrinsic base layer 31 were formed into the high-resistivity region 30A and the extrinsic base region 31A respectively. The high-resistivity region 30A extended underneath the extrinsic base region 31A. The extrinsic base region 31A contacted the intrinsic base region 25A, the second emitter region 24A, and the third emitter region 41A but separated from the first emitter region 23A. The area of the emitter contact layer 22 which extended outward of the high-resistivity region 30A and the extrinsic base region 31A was exposed. A base electrode 33 and an emitter electrode 34 were formed on the exposed extrinsic base region 31A and the exposed emitter contact layer 22 respectively. As a result, the HBT of the third embodiment was completed.

In the section (c) of FIG. 6, the arrow "A" denotes a collector current flowing from the first emitter region 23A to the collector region 26A via the second emitter region 24A, the third emitter region 41A, and the intrinsic base region 25A. In addition, the arrows "B" denote a leak current flowing from the first emitter region 23A to the extrinsic base region 31A via the second emitter region 24A.

The HBT of the third embodiment has the following advantages. An emitter has a three-layer structure including the first, second, and third emitter regions 23A, 24A, and 41A. The extrinsic base region 31A contacts the second emitter region 24A of N-$Al_{0.6}Ga_{0.4}As$ and the third emitter region 41A of N-$Al_{0.3}Ga_{0.7}As$ but separates from the first emitter region 23A of N-$Al_{0.3}Ga_{0.7}As$. Thus, the leak current "B" in the section (c) of FIG. 6 corresponds to the current-voltage characteristic curve "b" ($P_{0.3}/N_{0.3}$) of FIG. 2 in a region close to the intrinsic base region 25A, and corresponds to the current-voltage characteristic curve "d" ($P_{0.6}/N_{0.6}$) of FIG. 2 in a region remote from the intrinsic base region 25 which tends to be influenced by the parasitic resistance. In addition, the collector current "A" in the section (c) of FIG. 6 corresponds to the current-voltage characteristic curve "a" ($p/N_{0.3}$) of FIG. 2. Accordingly, the ratio between the collector current "A" and the leak current "B" in the HBT of the third embodiment is better than that in the prior-art HBT (see the section (c) of FIG. 1) including the combination of the junction "$p/N_{0.3}$" and the junction "$P_{0.3}/N_{0.3}$". Furthermore, in a large-current range, the HBT of the third embodiment is less adversely affected by the parasitic resistance and has a larger current gain as compared with the prior-art HBT (see the section (c) of FIG. 1).

As described previously, the first emitter region 23A and the third emitter region 41A are made of N-$Al_{0.3}Ga_{0.7}As$ while the second emitter region 24A is made of N-$Al_{0.6}Ga_{0.4}$. Thus, carrier energy levels at the lower edges of conduction bands in the first, second, and third emitter regions 23A, 24A, and 41A are approximately equal to each other, so that carriers (electrons) can be smoothly and freely moved through the boundaries between the first, second, and third emitter regions 23A, 24A, and 41A.

It should be noted that the third embodiment may be modified as follows. In a first modification, Mg ion used in the ion implantation is replaced by C ion, Be ion, or Zn ion. In a second modification, Mg ion used in the ion implantation is replaced by a combination of at least two of Mg ion, C ion, Be ion, and Zn ion. In a third modification, O ion used in the ion implantation is replaced by other ion such as H ion or B ion.

DESCRIPTION OF THE FOURTH PREFERRED EMBODIMENT

Figure 7A:
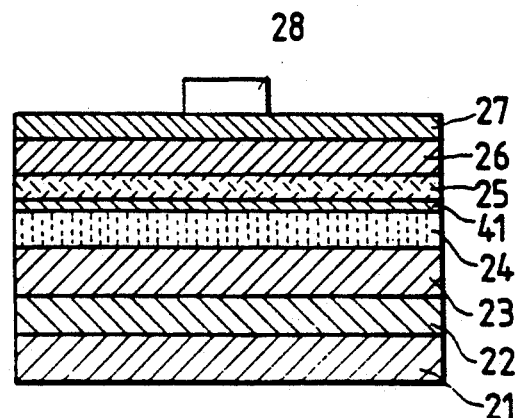
FIGS. 7(a)-(c) have sectional views of a semiconductor wafer in different states which occur during the fabrication of a heterojunction bipolar transistor according to a fourth embodiment of this invention.
Figure 7B:
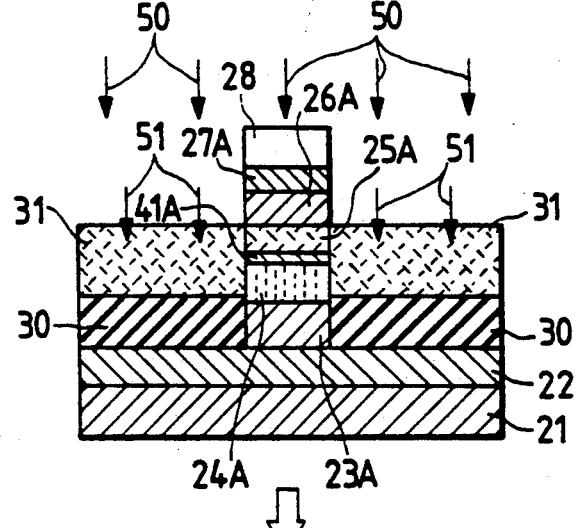
Figure 7C:
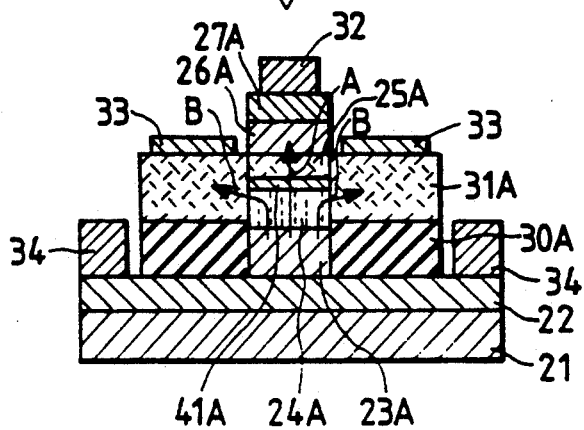

FIG. 7 relates to a fourth embodiment of this invention which is similar in structure to the embodiment of FIG. 6. The sections (a), (b), and (c) of FIG. 7 show wafer structures which occur at different stages during the fabrication of a heterojunction bipolar transistor (HBT) of the fourth embodiment. A description will be given of a method of fabricating the HBT of the fourth embodiment with reference to the sections (a), (b), and (c) of FIG. 7.

Specifically, the HBT of the fourth embodiment was fabricated as follows. As shown in the section (a) of FIG. 7, a semi-insulating substrate 21 made of GaAs was prepared, and seven epitaxial layers were sequentially superposed on the substrate 21. The seven epitaxial layers included an emitter contact layer 22, a first emitter layer 23, a second emitter layer 24, a third emitter layer 41, a base layer 25, a collector layer 26, and a collector cap layer 27. The emitter contact layer 22 was made of $n^+$-GaAs (for example, Si-doped, $n \approx 3 \times 10^{18}$ cm$^{-3}$) which had a high carrier concentration (density). The first emitter layer 23 was made of N-$Al_{0.3}Ga_{0.7}As$. The second emitter layer 24 was made of N-$Al_{0.6}Ga_{0.4}As$. The third emitter layer 41 was made of N-$Al_{0.3}Ga_{0.7}As$. The base layer 25 was made of $p^+$-GaAs (for example, Be-doped, $p \approx 1 \times 10^{19}$ cm$^{-3}$) which had a high carrier concentration (density). The collector layer 26 was made of n-GaAs. The collector cap layer 27 was made of $n^+$-GaAs (for example, Si-doped, $n \approx 5 \times 10^{18}$ cm$^{-3}$) which had a high carrier concentration (density). In this way, the wafer was provided with the multi-layer structure. Then, a mask 28 was formed on the collector cap layer 27.

Subsequently, the wafer was subjected to an etching process while the mask 28 was used. As a result of the etching process, the portion of the base layer 25 which extended outward of the mask 28 was exposed. In addition, as shown in the portion (b) of FIG. 7, the portions of the collector layer 26 and the collector cap layer 27 which extended outward of the mask 28 were removed so that the remaining portions of the collector layer 26 and the collector cap layer 27 which extended underneath the mask 28 formed the collector region 26A and the collector cap region 27A respectively.

Then, as shown in the section (b) of FIG. 7, a flow 51 of impurity of Zn was applied to the area of the wafer which extended outward of the mask 28 so that the impurity was injected and diffused into the area of the wafer. In addition, selective B+ ion implantation 50 into the wafer was carried out while the collector region 26A, the collector cap region 27A, and the mask 28 were used as implantation masks. As a result, the portions of the first emitter layer 23, the second emitter layer 24, the third emitter layer 41, and the base layer 25 which extended outward of the implantation masks were changed to a high-resistivity layer 30 and an extrinsic base layer 31. Specifically, the high-resistivity layer 30 was formed by the ion implantation while the extrinsic base layer 31 was formed by the impurity diffusion. It was preferable that the impurity diffusion was executed after the ion implantation. In this case, heating involved in the impurity diffusion was used also as annealing for completing the high-resistivity layer 30. The remaining portions of the first emitter layer 23, the second emitter layer 24, the third emitter layer 41, and the base layer 25 which extended underneath the implantation masks formed the first emitter region 23A, the second emitter region 24A, the third emitter region 41A, and the intrinsic base region 25A respectively. The high-resistivity layer 30 and the extrinsic base layer 31 were sequentially superposed on the area of the emitter contact layer 22 which extended outward of the first emitter region 23A, the second emitter region 24A, the third emitter region 41A, and the intrinsic base region 25A. In a region outward of the first emitter region 23A, the second emitter region 24A, the third emitter region 41A, and the intrinsic base region 25A, the high-resistivity layer 30 originated from the first emitter layer 23 and a lower part of the second emitter layer 24 while the extrinsic base layer 31 originated from the remaining part of the second emitter layer 24, the third emitter layer 41, and the base layer 25. The extrinsic base layer 31 contacted the second emitter region 24A and the third emitter region 41A but separated from the first emitter region 23A. The high-resistivity layer 30 extended underneath the extrinsic base layer 31 to separate the extrinsic base layer 31 from the fist emitter region 23A and the emitter contact layer 22.

Then, as shown in the section (c) of FIG. 7, the mask 28 was removed, and the high-resistivity layer 30 and the extrinsic base layer 31 were formed into the high-resistivity region 30A and the extrinsic base region 31A respectively. The high-resistivity region 30A extended underneath the extrinsic base region 31A. The extrinsic base region 31A contacted the intrinsic base region 25A, the second emitter region 24A, and the third emitter region 41A but separated from the first emitter region 23A. The area of the emitter contact layer 22 which extended outward of the high-resistivity region 30A and the extrinsic base region 31A was exposed. A base electrode 33 and an emitter electrode 34 were formed on the exposed extrinsic base region 31A and the exposed emitter contact layer 22 respectively. As a result, the HBT of the fourth embodiment was completed.

In the section (c) of FIG. 7, the arrow "A" denotes a collector current flowing from the first emitter region 23A to the collector region 26A via the second emitter region 24A, the third emitter region 41A, and the intrinsic base region 25A. In addition, the arrows "B" denote a leak current flowing from the first emitter region 23A to the extrinsic base region 31A via the second emitter region 24A.

The HBT of the fourth embodiment has the following advantages. An emitter has a three-layer structure including the first, second, and third emitter regions 23A, 24A, and 41A. The extrinsic base region 31A contacts the second emitter region 24A of N-$Al_{0.6}Ga_{0.4}As$ and the third emitter region 41A of N-$Al_{0.3}Ga_{0.7}As$ but separates from the first emitter region 23A of N-$Al_{0.3}Ga_{0.7}As$. Thus, the leak current "B" in the section (c) of FIG. 7 corresponds to the current-voltage characteristic curve "b" ($P_{0.3}/N_{0.3}$) Of FIG. 2 in a region close to the intrinsic base region 25A, and corresponds to the current-voltage characteristic curve "d" ($P_{0.6}/N_{0.6}$) Of FIG. 2 in a region remote from the intrinsic base region 25 which tends to be influenced by the parasitic resistance. In addition, the collector current "A" in the section (c) of FIG. 7 corresponds to the current-voltage characteristic curve "a" ($p/N_{0.3}$) of FIG. 2. Accordingly, the ratio between the collector current "A" and the leak current "B" in the HBT of the fourth embodiment is better than that in the prior-art HBT (see the section (c) of FIG. 1) including the combination of the junction "$p/N_{0.3}$" and the junction "$P_{0.3}/N_{0.3}$". Furthermore, in a large-current range, the HBT of the fourth embodiment is less adversely affected by the parasitic resistance and has a larger current gain as compared with the prior-art HBT (see the section (c) of FIG. 1). In addition, the impurity diffusion enables the surface of the extrinsic base layer 31 to be high in carrier concentration (density), so that the resultant base resistance can be lowered.

The method of fabricating the HBT of the fourth embodiment can be relatively simple since heating involved in the impurity diffusion can be used also as annealing for completing the high-resistivity layer 30.

As described previously, the first emitter region 23A and the third emitter region 41A are made of N-$Al_{0.3}Ga_{0.7}As$ while the second emitter region 24A is made of N-$Al_{0.6}Ga_{0.4}$. Thus, carrier energy levels at the lower edges of conduction bands in the first, second, and third emitter regions 23A, 24A, and 41A are approximately equal to each other, so that carriers (electrons) can be smoothly and freely moved through the boundaries between the first, second, and third emitter regions 23A, 24A, and 41A.

It should be noted that the fourth embodiment may be modified as follows. In a first modification, Zn used in the impurity diffusion is replaced by Be or Mg. In a second modification, B ion used in the ion implantation is replaced by other ion such as H ion or O ion.

What is claimed is:

1. A heterojunction bipolar transistor comprising:
    a first emitter region,
    a second emitter region extending on the first emitter region and connected to the first emitter region via a junction, the second emitter region having a forbidden band gap wider than a forbidden band gap of the first emitter region, wherein, at the junction, the second emitter region has a carrier energy level substantially equal to a carrier energy level of the first emitter region;

an intrinsic base region extending on the second emitter region and having a forbidden band gap narrower than the forbidden band gap of the second emitter region;

a collector region extending on the intrinsic base region;

an extrinsic base region extending outward of the intrinsic base region and contacting the intrinsic base region and the second emitter region, the extrinsic base region separated from the first emitter region, wherein a portion of the extrinsic base region which adjoins the second emitter region has a forbidden band gap substantially equal to the forbidden band gap of the second emitter region; and a high-resistivity region extending underneath the extrinsic base region.

2. The heterojunction bipolar transistor of claim 1, wherein the extrinsic base region is separated from the first emitter region by the high-resistivity region.

3. The heterojunction bipolar transistor of claim 1, wherein the extrinsic base region is separated from the first emitter region by the high-resistivity region and by the second emitter region.

4. The heterojunction bipolar transistor of claim 1, wherein the heterojunction bipolar transistor is a longitudinal configuration transistor including a substrate, wherein said first emitter region is on said substrate.

5. A heterojunction bipolar transistor comprising:
a first emitter region;
a second emitter region extending on the first emitter region and connected to the first emitter region via a first junction, the second emitter region having a forbidden band gap wider than a forbidden band gap of the first emitter region, wherein, at the first junction, the second emitter region has a carrier energy level substantially equal to a carrier energy level of the first emitter region;

a third emitter region extending on the second emitter region and connected to the second emitter region via a second junction, the third emitter region having a forbidden band gap narrower than the forbidden band gap of the second emitter region, wherein, at the second junction, the third emitter region has a carrier energy level substantially equal to a carrier energy level of the second emitter region;

an intrinsic base region extending on the third emitter region and having a forbidden band gap narrower than the forbidden band gap of the third emitter region;

a collector region extending on the intrinsic base region;

an extrinsic base region extending outward of the intrinsic base region, wherein a portion of the extrinsic base region which adjoins the second emitter region has a forbidden band gap substantially equal to the forbidden band gap of the second emitter region, and wherein the extrinsic base region contacts the intrinsic base region, the second emitter region, and the third emitter region but is separated from the first emitter region; and a high-resistivity region extending underneath the extrinsic base region.

6. The heterojunction bipolar transistor of claim 5, wherein the extrinsic base region is separated from the first emitter region by the high-resistivity region.

7. The heterojunction bipolar transistor of claim 5, wherein the extrinsic base region is separated from the first emitter region by the high-resistivity region and by the second emitter region.

8. The heterojunction bipolar transistor of claim 5, wherein the heterojunction bipolar transistor is a longitudinal configuration transistor including a substrate, wherein said first emitter region is on said substrate.

* * * * *